United States Patent [19]

Luyten et al.

[11] Patent Number: 4,893,080

[45] Date of Patent: Jan. 9, 1990

[54] VOLUME-SELECTIVE SPECTROSCOPY USING REFOCUSED ECHOES

[75] Inventors: Peter R. Luyten; Jan A. Den Hollander; Johannes H. Den Boef; Johannes J. Van Vaals, all of Eindhoven, Netherlands

[73] Assignee: U.S. Philips Corporation, New York, N.Y.

[21] Appl. No.: 230,630

[22] Filed: Aug. 10, 1988

[30] Foreign Application Priority Data

Aug. 12, 1987 [NL] Netherlands .......................... 8701889

[51] Int. Cl.[4] .............................................. G01R 33/20
[52] U.S. Cl. ....................................... 324/309; 324/307
[58] Field of Search ................ 324/300, 307, 309, 312, 324/314; 128/653

[56] References Cited

U.S. PATENT DOCUMENTS

| | | | |
|---|---|---|---|
| 4,238,735 | 12/1980 | Muller | 324/314 |
| 4,297,637 | 10/1981 | Crooks et al. | 324/309 |
| 4,458,203 | 7/1984 | Young | 324/309 |
| 4,585,993 | 4/1986 | Bottomly et al. | 324/309 |
| 4,678,995 | 7/1987 | Avison et al. | 324/309 |
| 4,680,546 | 7/1987 | Dumoulin et al. | 324/307 |
| 4,748,409 | 5/1988 | Frahm et al. | 324/309 |

OTHER PUBLICATIONS

J. Frahm et al., "Stimulated Echo Imaging", Journal of Magnetic Resonance 64, pp. 81–93 (1985).
E. L. Hahn et al., "Spin Echos", Physical Review, Vol. 80, No. 4, Nov. 15, 1950.

Primary Examiner—Michael J. Tokar
Attorney, Agent, or Firm—Thomas A. Briody; Jack E. Haken; Jack D. Slobod

[57] ABSTRACT

The measurement of localized spectra by means of stimulated echoes is known per se. Using three 90° pulses, stimulated echoes are then generated; these pulses are selective or not. However, this technique it is not suitable for measuring good proton spectra of metabolites because the response of the non-bound protons is much greater than the response of the bound protons. In accordance with the invention, a fourth (spatially selective) 180° refocusing pulse is added to a pulse sequence consisting of a 90° non-spatially selective but frequency-selective pulse and two subsequent 90° spatially selective pulses. Thus, a refocused stimulated echo is generated in which the response of the non-bound protons is suppressed and which contains only signals from the chemically bound protons. The proposed methods are particularly suitable for measurements on lactate because of the excellent spectral editing properties.

8 Claims, 2 Drawing Sheets

VOLUME-SELECTIVE SPECTROSCOPY USING REFOCUSED ECHOES

BACKGROUND OF THE INVENTION

1. Field of the Invention

The invention relates to a method of determining a nuclear magnetization distribution in a region of an object in which a stimulated echo is generated and sampled by means of a sequence of four rf pulses in combination with different gradient magnetic fields.

2. Description of the Related Art

A method of this kind can be used for spectroscopy measurements and also for imaging measurements where zoom techniques can also be applied when use is made of the selective excitation pulses, as described in a publication by Frahm et al, Journal of Magnetic Resonance, 64, pages 81-93, 1985. Using such a pulse sequence, a small sub-volume of the object can be selected for spectroscopic or imaging measurements as described in European Patent Application 0.184.840 (corresponding to U.S. Pat. No. 4,748,409) where each time a different gradient magnetic field is activated for each 90° pulse of the three-pulse sequence. Using the described method a high-resolution image can be made of a small sub-volume. However, if spectroscopy is to be performed, the described method is very suitable for selecting a small volume, but imposes the problem that this sequence is not suitable for use with a water suppression method. Water suppression is necessary for the measurement of, for example, metabolites in proton spectra. The suppression of the water peak is necessary because the water protons represent the vast majority of the excited nuclear spins.

Therefore, European Patent Application 0.184.840 proposes the application of a 180° refocusing pulse after the three spatially selective 90° pulses. By suitably choosing the intervals between the successive first and second 90° pulse, between the second and the third 90° pulse, and between the third 90° pulse and the 180° refocusing pulse, the water peak can be suppressed as described with reference to FIG. 36 of the cited Application.

However, the proposed pulse sequence leads to a mediocre suppression only of the undesirable component, because suppression is based on differences in relaxation time constants (T1 and T2 relaxation time constant). It is also to be noted that the non-selective 180° pulse will never be ideal and causes interference signals which have a substantial adverse effect on the quality of the echo resonance signal formed.

It is a further drawback of the pulse sequences described in European Patent Application 0.184.840 that they cannot be used for the examination of materials having a comparatively short T2 relaxation time constant.

SUMMARY OF THE INVENTION

It is an object of the invention to provide a method which utilizes a modification of a pulse series proposed by E. L. Hahn in Physical Review, Vol. 80, No. 4, Nov. 15, 1950, which modification results in methods offering a wider range of examinations.

It is notably an object of the invention to provide a method where a sub-volume can be selected by means of a sequence of different rf pulses and the use of associated, different gradient magnetic fields, and which very well enables the use of the water suppression technique.

It is a further object of the invention to provide a method of the kind set forth which is very suitable for the examination of materials having a comparatively short T2 relaxation time constant.

To achieve this, the invention is characterized in that the sequence comprises at least four rf pulses a first pulse of which is a frequency-selective 90° excitation pulse and in that either a first following rf pulse or a third-following rf pulse is a refocusing pulse (180° pulse). By using a frequency-selective excitation pulse as the beginning of the pulse sequence, a situation is obtained where complete suppression of an undesirable resonance line is possible.

A version of a method in accordance with the invention is characterized in that a gradient magnetic field is activated during at least one of the three rf pulses succeeding the frequency-selective pulse. A method of this kind offers the advantage that signals are derived only from a part of the object which is limited by the bandwidth of the rf pulse and the strength and the direction of the gradient magnetic field.

A further version of a method in accordance with the invention is characterized in that the pulse sequence comprises a sequence of three 90° rf pulses and one 180° rf pulse, a gradient field being activated at least during the 180° pulse. A method of this kind offers the advantage that the refocused stimulated echo signal originates only from a limited, desirable part of the object, resulting in an attractive reduction of interference and noise signals in the echo signal.

A preferred version of a method in accordance with the invention is characterized in that the refocusing pulse is the second pulse of the pulse sequence and in that each time a different gradient field is activated during the second, the third and the fourth excitation pulse. The preferred version of the method in accordance with the invention selects a sub-volume which is limited in three dimensions in an object, thus enabling suppression of an undesirable resonance line in the spectrum. This method enables high resolution measurements spatially as well as in the spectrum. The method where a high-resolution image of the part of the object which is spatially limited in three dimensions is formed is characterized in that a gradient magnetic field is applied during a period subsequent to an rf pulse in which a transversal magnetization is present. This method enables the determination of, for example a spatial distribution of a magnetization distribution, but also the determination of a spectrum for each volume element in which an undesirable peak of the spectrum (for example, a peak which is so dominant that it masks the other, more informative peaks in the spectrum) is suppressed.

This version of the method offers the advantage that a read pulse, that is to say a 90° pulse or an $\alpha°$ pulse ($\alpha < 90°$) is present just before the beginning of the data acquisition, so that only minimum disturbances will occur in the stimulated echo formed. This is due to the fact that the excitation pulse forms only signals originating from the nuclear spins rotated with respect to their longitudinal magnetization by the excitation pulse. This situation enables the dephasing, during the period preceding the read pulse, all transversely magnetized nuclear spins by means of a gradient magnetic field. This version of the method in accordance with the invention also enables the so-called multiple slice technique to be performed, where different parts of an object can be independently sampled during a measuring sequence. The proposed method in accordance with the invention thus enables measurement of the individual parts at the expense of only a small additional measuring period, because it is only necessary to generate the different read pulses with each time a different central frequency.

When α° pulses are used for the read pulses, a first pulse can then be used to form an echo signal which is sampled, in the absence of a gradient magnetic field, in order to determine a localized spectrum, after which a second α° pulse is used to generate a second echo which is measured in the presence of a gradient field in order to determine a density distribution with a very high resolution (zoom imaging).

A version of the method in accordance with the invention is characterized in that at least one further refocusing pulse is generated after a read pulse. This version of the method in accordance with the invention offers the advantage that multiple echo signals are also obtained.

The described method in accordance with the invention offers the same possibilities as the standard stimulated echo sequence methods, but also offers additional measuring possibilities, which is advantageous; however, the rf pulses (90° or 180°) are not critical for the described method. Deviations from the non-ideal flip angles 90° and 180° are permissible, without having an excessive effect on the quality (S/N) of the signals measured.

BRIEF DESCRIPTION OF THE DRAWINGS

The invention will be described in detail hereinafter with reference to the drawing; therein.

DESCRIPTION OF THE PREFERRED EMBODIMENTS

Figure 1:
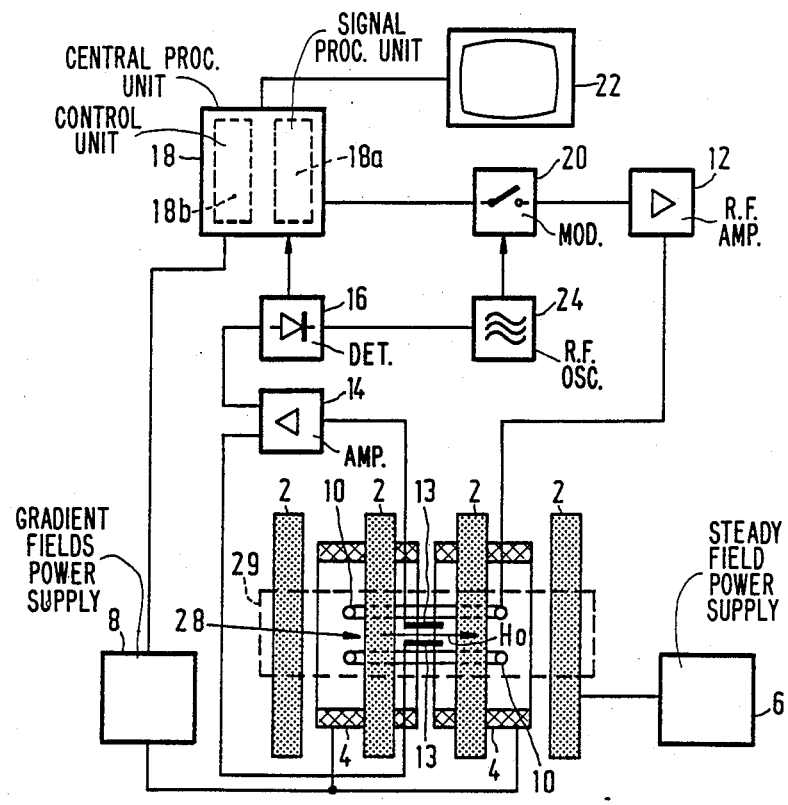
FIG. 1 shows a device in accordance with the invention.

FIG. 1 shows a magnetic resonance measuring apparatus, comprising a magnet system 2 for generating a steady magnetic field H0, a magnet system 4 for generating gradient magnetic fields, and power supply sources 6 and 8 for the magnet system 2 and the magnet system 4, respectively. An rf magnet coil 10 serves to generate an rf magnetic alternating field; to this end, it is connected to an rf amplifier 12. For the detection of the resonance signal generated in an object to be examined by the rf transmitter field use is made of an rf coil 13 which is connected to a signal amplifier 14 for this purpose. The signal amplifier 14 is connected to a detector 16 which is connected to a central processing unit 18. The central processing unit 18 also controls a modulator 20 which feeds rf amplifier 12, the power supply source 8 for the gradient magnet coils, and a monitor 22 for display. An rf oscillator 24 powers the modulator 20 as well as the detector 16. The transmitter coil 10, arranged within the magnet systems 2 and 4, encloses a measuring space 28 in which an object to be examined can be arranged. A steady magnetic field H0, gradient magnetic fields for selecting object slices, and a spatially uniform magnetic alternating field can thus be generated within the measuring space 28. The measuring space 28, the transmitter coil 10 and the receiver coil 13 are enclosed by an rf shielding cage 29 which serves to shield the environment from the rf signals occurring in the measuring space 28. The central processing device 18 comprises a signal processing unit 18a and a control unit 18b. The signal processing unit 18a processes the signals received by the receiver coil 13 in order to form, for example two-dimensional images (2D density distributions, spectra) which are displayed on the monitor 22. The control unit 18b comprises programmable control means which control the modulator 20 as well as the magnet power supply 8, so that the device shown in FIG. 1 is capable of performing measuring sequences consisting of cycles of rf pulse sequences which are applied in combination with gradient magnetic fields or not. Thus, in an object or in a part of an object nuclear spins can be excited, the position of the excited spins being dependent on the applied rf pulse, notably on the frequency thereof, and on the applied gradient magnetic fields in combinations with the steady magnetic field H0 present.

Figure 2:
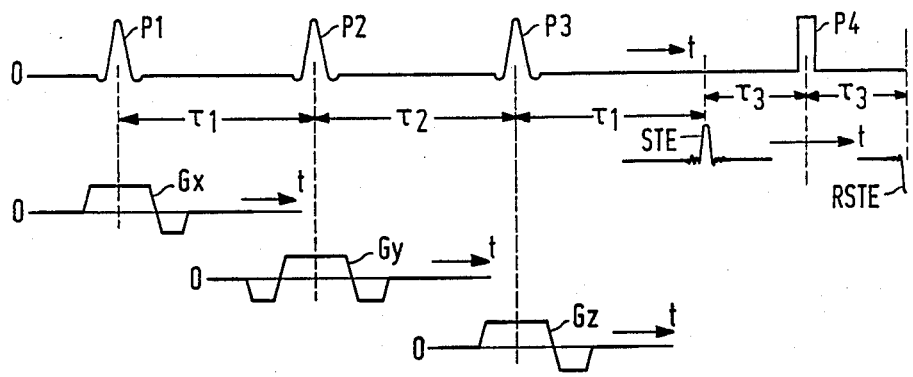
FIG. 2 shows a time diagram of a known pulse sequence for generating a stimulated echo from a sub-volume of an object.

FIG. 2 shows a time diagram of a pulse sequence for generating stimulated echoes. The pulse sequence comprises three 90° rf pulses P1, P2 and P3 wherebetween the periods τ1 and τ2 elapse. At the first 90° pulse P1, a first gradient magnetic field Gx is applied, at the second and the third 90° pulse, P2 and P3, respectively, there is applied a selection gradient Gy and Gz, respectively. From the publication by Frahm et al, Journal of Magnetic Resonance, 64, pages 81-93, 1985, it can be derived that this pulse sequence generates a stimulated echo STE from a sub-volume of an object which is defined by the three different gradient magnetic fields Gx, Gy and Gz. This method, however, has the drawback, that upon excitation of protons, the water peak is very strong in comparison with the chemically bound protons which occur in much smaller numbers. The stimulated echo signal generated, therefore, is dominated by the responses of the non-bound protons. The desired signals of the chemically bound protons are thus "masked" in a given sense, which is undesirable. Therefore, European Patent Application 0.184.840 proposes the generating of a fourth pulse P4 (a non-selective 180° pulse) after the three 90° pulses P1, P2 and P3 so that, when τ1, τ2 and τ3 are suitably chosen, a refocused stimulated echo RSTE is generated in which the "water peak" or another undesirable peak is suppressed. As has already been stated, the results to be obtained by means of the sequence shown in FIG. 2 are not satisfactory.

Figure 3:
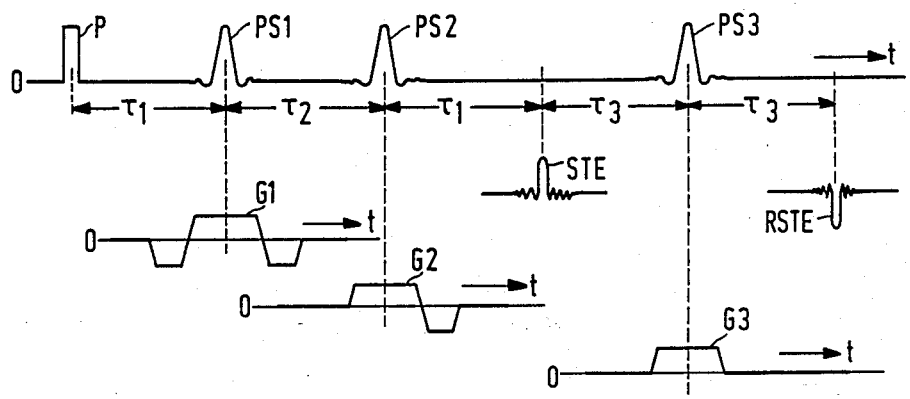
FIG. 3 shows a time diagram of a method with the pulse sequence in accordance with the invention.

FIG. 3 shows a pulse sequence for generating stimulated echos where the described drawback is avoided. The sequence comprises three successive 90° pulses, the first pulse P not being spatially selective but frequency-selective; the second pulse PS1 is applied in the presence of a gradient field G1; the third 90° excitation pulse PS2 is applied in the presence of a gradient field G2. Using this sequence a stimulated echo STE is generated. By using a 180° pulse PS3 in the presence of a selective gradient G3, a refocused stimulated echo RSTE is generated which originates from a volume which is determined by the applied gradient magnetic fields G1, G2 and G3 whose gradient directions extend mutually perpendicularly.

Figure 4:
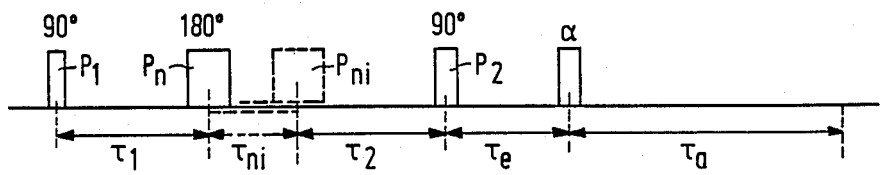
FIG. 4 shows a time diagram of a preferred version of a method in accordance with the invention.

FIG. 4 illustrates a preferred version of a method in accordance with the invention. The measuring sequence commences with a pulse P1, being a 90° excitation pulse, which is succeeded by at least one 180° time reversal pulse Pn after a waiting period τ1. The 180° pulse Pn may be followed, after a waiting period τni, by one further or several rf pulses Pni; it is not necessary for the waiting periods τni between the various 180° rf pulses to be equal. The further rf pulse Pni may be, for example a frequency-selective pulse allowing the dephasing of undesirable excitations, possibly with a gradient magnetic field to be subsequently activated. The series of 180° pulses Pni may comprise identical (for example, frequency-selective) pulses, which brings about an improvement of the signal (for example, suppression of the water peak). The last 180° time reversal pulse Pni or Pn is followed by a second 90° excitation pulse P2, after a waiting period τ2. During and/or between said 90° pulses or 180° pulses P2, Pn or Pni or Pn2, gradient magnetic fields are applied or not. For the selective excitation of a given volume of an object to be measured, a gradient magnetic field should be applied during the pulses Pn, Pni or P2. The pulses will then have a spatially selective effect.

During the periods τ1, τni, τ2 a gradient magnetic field can be applied, either to impart a space-dependent phase code to excited nuclear spins or to create dephasing among nuclear spins which are not allowed to make a signal contribution after an rf read pulse. The use of gradient magnetic fields or not, as described with reference to FIG. 3 is also possible in the measuring cycle described with reference to FIG. 2, be it that the 180° pulse is preferably a spatially selective pulse for the measurement of objects with location-dependent distributions (spectra).

A multiple slice technique can be carried out very well by means of the method in accordance with the invention for a measuring cycle as shown in FIG. 4. For example, the three rf pulses, i.e. the first and the second 90° excitation pulse, P1 and P2, and the 180° pulse Pn can be used for the selective excitation of a given part of an object, after which a sub-part within said part is excited by means of a selective α pulse and the resonance signal derived therefrom is sampled during the acquisition period τa after this α pulse. After this acquisition period τa, there is applied a further α pulse, be it a selective α pulse, having a different transmission frequency. The use of an α pulse having a different transmission frequency in combination with an applied gradient field ensures that another sub-part of the excited part of the object is addressed, so that resonance signals are derived therefrom. The foregoing can be repeated each time after an acquisition period τa, each time an α pulse having a different central frequency being applied in the presence of the same gradient magnetic field. The set up may be such that each time sampled subparts ultimately form the total excited part of the object. It will be apparent that, when different gradient magnetic fields are used, each time a different slice thickness can also be selected.

The proposed method enables the use of refocusing pulses after termination of the measuring sequence shown in FIG. 2, so that multiple echo signals are obtained.

The method shown in FIG. 4 is very suitable for performing measurements on matter having a small T2 relaxation time constant, because the method offers the advantage that the effective measuring time (that is to say the effect of time on the nuclear spins) is reduced due to the use of the (spatially selective) 180° pulse.

The methods described with reference to the FIGS. 3 and 4 are extremely suitable for spectroscopic examinations, notably for obtaining spatially resolved (phase encoded) spectra in a (small) sub-volume in an object (chemical shift imaging; spectral editing); this is very advantageous for the measurement of metabolites in proton spectra. The foregoing will be illustrated on the basis of an example involving lactate examination. The lactate molecule contains (ignoring oxygen atoms and OH combinations) a carbon atom whereto there are bound a hydrogen proton, the α proton, and a $CH_3$ group which, after excitation, supply signals during a magnetic resonance hydrogen examination. The α proton supplies a resonance signal (α peak) which is situated just besides the resonance line of $H_2O$-bound hydrogen atoms. The $CH_3$ group supplies a resonance signal exhibiting a chemical shift σ slightly larger than that of the α proton, thus exhibiting small peaks in the spectrum, the α peak being situated between these peaks and the very pronounced resonance peak of the $H_2O$-bound protons. The $CH_3$ groups of the lactate molecules produce two peaks (resonance frequency difference 7 Hz), because a $CH_3$ group experiences the α proton either as a positive magnetic dipole or as a negative magnetic dipole.

The use of a measuring cycle as shown in the FIGS. 3 or 4 results in the suppression of the strong water peak, so that a locally measured spectrum clearly shows the α peak and the two small peaks of the $CH_3$ group. The latter two peaks are very important. By performing the measuring cycle twice, i.e. once where the frequency spectrum of the 180° pulse includes the α peak and once where it does not include this peak, the α peak will be cancelled when the spectra calculated from the measurements are added, and the two peaks of the $CH_3$ group wil be intensified. It will be apparent that alternatively first the measured resonance signals can be added, so that the spectrum calculated from the added resonance signals does not exhibit an α peak but intensified $CH_3$ peaks.

The water suppression method described with reference to the FIGS. 3 and 4 can be optimized by applying, prior to the cycles shown, one or more narrow band (20 Hz) 90° excitation pulses adapted to the resonance line of water, which excitation pulses are followed by a dephasing gradient field so that the nuclear spins of the hydrogen protons have already been completely dephased prior to the chemically selective excitation pulse. Alternatively, after the second 90° pulse in the measurement cycles of the FIGS. 3 and 4 there may be applied a further narrow band (20 Hz) 90° pulse adapted to the resonance line of hydrogen protons, which further pulse is also succeeded by a gradient magnetic field which dephases the transversely magnetized hydrogen protons.

What is claimed is:

1. A method of determining a nuclear magnetization distribution in at least a part of an object, such part of the object being excited by a sequence of rf pulses generating a refocussed stimulated echo from such part which is sampled; characterized in that the sequence comprises at least four rf pulses, a first pulse of which is a frequency-selective 90° excitation pulse, and another pulse of which is a refocussing 180° pulse.

2. A method as claimed in claim 1, characterized in that a gradient magnetic field is applied at least during one of the three rf pulses succeeding the frequency-selective first pulse.

3. A method as claimed in claim 1, characterized in that the pulse sequence comprises three 90° rf pulses and one 180° rf pulse, a gradient field being activated at least during the 180° pulse.

4. A method as claimed in claim 1, characterized in that the refocusing pulse is the second pulse of the pulse sequence and in that a different gradient field is activated during each of the second, the third and the fourth pulse.

5. A method as claimed in claim 1, characterized in that first frequency-selective pulse is followed by a cycle of n 180° pulses, where $n \geq 2$ which are frequency selective or spatially selective in combination with a gradient magnetic field, the periods between the 180° pulses being adjustable.

6. A method as claimed in claim 5, characterized in that the cycle of n 180° pulses comprises only identical pulses.

7. A method as claimed in claim 1, characterized in that there are two rf pulses succeeding the 180° pulse and which are a 90° pulse and a read pulse, respectively, the read pulse being an $\alpha°$ pulse, where $\alpha \leq 90°$.

8. A method as claimed in claim 1, characterized in that a gradient magnetic field is applied during a period, subsequent to an rf pulse, in which a transverse magnetization is present.

* * * * *